(12) United States Patent
Ku

(10) Patent No.: US 6,600,328 B2
(45) Date of Patent: Jul. 29, 2003

(54) ANALOG METHOD AND CIRCUIT FOR MONITORING DIGITAL EVENTS PERFORMANCE

(75) Inventor: Joseph Weiyeh Ku, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 23 days.

(21) Appl. No.: 09/935,021

(22) Filed: Aug. 22, 2001

(65) Prior Publication Data

US 2003/0038643 A1 Feb. 27, 2003

(51) Int. Cl.[7] ............................................. G01R 27/26
(52) U.S. Cl. ...................................................... 324/678
(58) Field of Search ................................ 324/674, 676, 324/677, 678, 679, 681, 76.66, 76.67, 76.69

(56) References Cited

U.S. PATENT DOCUMENTS

| | | | | |
|---|---|---|---|---|
| 3,626,204 A | * | 12/1971 | Brandon | 307/233 |
| 4,219,719 A | * | 8/1980 | Frosien et al. | 219/121 EM |
| 4,785,223 A | * | 11/1988 | Hank et al. | 318/636 |
| 5,006,739 A | * | 4/1991 | Kimura et al. | 307/270 |
| 5,121,067 A | * | 6/1992 | Marsland | 324/637 |
| 5,243,637 A | | 9/1993 | Flaherty et al. | 377/95 |
| 5,576,628 A | * | 11/1996 | Caliboso et al. | 324/678 |
| 5,956,004 A | * | 9/1999 | Hush et al. | 345/77 |
| 5,961,577 A | | 10/1999 | Soenen et al. | 708/251 |
| 6,149,319 A | * | 11/2000 | Richter et al. | 395/750.01 |
| 6,373,256 B1 | * | 4/2002 | Hanjani et al. | 324/433 |

* cited by examiner

*Primary Examiner*—Safet Metjahic
*Assistant Examiner*—Etienne P Leroux

(57) ABSTRACT

An analog performance monitoring method and circuit arrangement are adapted to count a plurality of digital event pulses. Each digital event pulse controls a switching circuit to pass a substantially fixed amount of charge from a power supply. The charge is accumulated in a capacitor. In one example embodiment, the switching circuit is a transistor biased by the capacitor voltage to operate in a constant current region. The capacitor has a capacity to accumulate charge added from at least 100,000 digital event pulses maintaining bias of transistor operation in the constant current region. A comparator circuit monitors capacitor charge and signals when a quantity of events adding charge to the capacitor reaches a selectable threshold. In another example embodiment, a programmable voltage divider provides a controllable threshold. A reset circuit discharges the capacitor to an approximate ground level. Sampling is used to estimate a population of digital event pulses.

24 Claims, 4 Drawing Sheets

ANALOG METHOD AND CIRCUIT FOR MONITORING DIGITAL EVENTS PERFORMANCE

CROSS-REFERENCE TO RELATED APPLICATIONS

This application is related to applications entitled, "Digital Event Sampling Circuit and Method," by Joseph Weiyeh Ku, Ser. No. 09/934,891 and "Fine-Grained Thermal Control In Memory Subsystems," by Joseph Weiyeh Ku and Chandrakant Patel, Ser. No. 09/934,615, filed in the United States Patent and Trademark Office on the same date as the present application. The above-mentioned related applications are incorporated by reference into this present application.

FIELD OF THE INVENTION

The present invention generally relates to the design of integrated circuit devices and, more particularly, to monitoring digital event performance using an analog circuit.

BACKGROUND OF THE INVENTION

It is desirable to monitor the performance of digital circuits for a variety of purposes. As component and circuit physical size decrease, and the complexity and speed of integrated circuits increases, entire systems comprising a plurality of functional blocks are contained in single chips. In order to monitor the performance of these systems, or portions thereof, large numbers of monitors are deployed in different locations on the chip to get a good performance evaluation of the system. One method to monitor the performance of digital circuits is to count the quantity of digital operations occurring within a known period of time.

Counting digital events as a way of measuring performance has conventionally been accomplished using binary counter circuits. An advantage of using binary counters is the ability to count digital events precisely. A typical binary counter capacity is in the range of 10 to 20 bits in length, the capacity being designed to accommodate the quantity of expected events. Binary counter capacity is limited by the amount of physical space necessary to construct each counter, the space available, the circuit complexity needed to interconnect the counter, and the operation time required to periodically interrogate the counter's stored information.

Despite providing a precise event count, several significant disadvantages are also associated with digital counters. As clock speeds continue to increase, the rate and quantity of digital events occurring within a fixed time period also increase. This increase in the quantity of digital events to count can quickly consume the capacity of a binary counter. Increasing binary counter capacity commensurate with increased clock speed requires more overhead circuitry, such as a long scan chain to improve the testability of the counter. The complexity of large binary counters, and the accompanying circuitry necessary to interconnect larger digital counters to other performance monitoring logic, also increases costs and occupies valuable integrated circuit space. In many digital event performance evaluation applications, a precise event count is not necessary. In some evaluation applications, an approximate count of the entire population is adequate, for example, in regulating system chip power or dispatching chip cooling mechanisms.

A method and circuit for monitoring the performance of digital systems that address the aforementioned problems, as well as other related problems, are therefore desirable.

SUMMARY OF THE INVENTION

The present invention is directed to an analog method and circuit arrangement for monitoring digital event performance. The present invention is exemplified in a number of implementations and applications, some of which are summarized below.

According to an example embodiment of the present invention, an analog performance monitoring method and circuit arrangement are provided. The circuit arrangement is adapted to approximately count a plurality of digital event pulses. The circuit arrangement includes a switching circuit coupled between a constant current source and a capacitor. In one example embodiment, the constant current source is a biased field effect transistor ("FET") and power supply. Each digital event pulse controls the switching circuit to pass a substantially fixed amount of charge from the constant current source to accumulate in the capacitor. In one example embodiment, the switching circuit is a transistor responsive to the digital event pulses, the capacitor operating in a linear voltage range wherein capacitor voltage is approximately linear in proportion to the accumulated capacitor charge. In one example embodiment, the capacitor has a capacity to accumulate a substantially fixed amount of charge for each of at least 100,000 digital event pulses. A comparator circuit is coupled to the capacitor and a voltage divider circuit. The comparator circuit generates an output signal responsive to the quantity of digital events counted, as represented by charge accumulated in the capacitor, with respect to a voltage threshold level selected by the voltage divider circuit. In another example embodiment, the voltage divider is programmable and provides a controllable count threshold. A reset circuit discharges the capacitor to a known starting charge level, for example, to a substantially zero charge level.

According to another example embodiment of the present invention, the constant current source comprises a switching transistor and a power supply, the switching transistor being biased in a constant drain current operating region.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
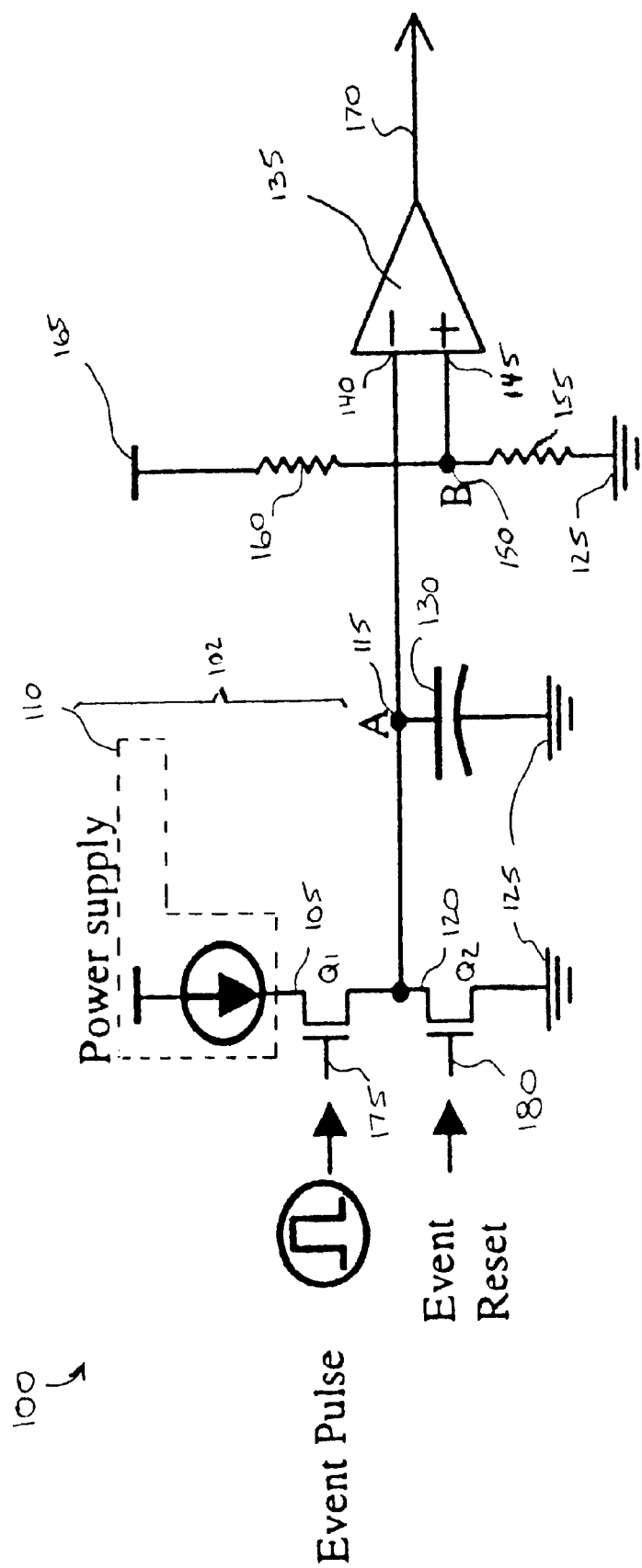
FIG. 1 is a circuit diagram of one example embodiment of a circuit arrangement for monitoring digital event performance in accordance with the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Monitoring the performance of digital events often involves counting the quantity of event occurrences, or more particularly, counting the quantity of event occurrences within a finite period of time to determine a rate. Optionally, the counted quantity is compared to a threshold quantity, or threshold rate, as a basis for determining a course of action appropriate to the measured performance. The present invention uses an analog approach to monitor digital activities. In one example embodiment, by measuring an approximate quantity or rate of digital events where a precise event count is not necessary, cost, space, circuit complexity and operational efficiency advantages are realized over binary counters. One application of the present invention is to effectively monitor signal path (e.g., bus) activity from various functional units within a VLSI system chip.

Example applications where precise digital event counting is not required include monitoring a duty cycle (i.e., percentage) of an executing floating point unit, monitoring a cache access rate to regulate chip power, chip processing speed, and/or to dispatch cooling mechanisms. Illustrating further the cooling dispatch example, the amount of heat generated by a particular operation (i.e., digital event) is often known, or can be determined experimentally. Therefore, monitoring the occurrence of these particular digital events enables quantification of the total amount of heat generated by circuit operations before the heat is detectable by thermal measurement. Cooling mechanisms are then dispatchable in anticipation of measurable thermal changes to control heat removal rates commensurate with heat generation rates. In a particular example, bus activity between a processor and memory structures is monitored using the circuit arrangement of the present invention to predict heat generated by memory access operations in order to control memory structure cooling apparatus.

The circuit arrangement of the present invention can be implemented in VLSI technology occupying less area than binary counters. One advantage in using a storage capacitor instead of a binary counter in modern VLSI technology is that the capacitor can be constructed beneath a multi-layer metal interconnect, thus preserving valuable chip surface area for active devices. In addition, the circuit arrangement of the present invention does not require long serial scan vectors for manufacturing tests. Therefore, the circuit arrangement of the present invention is particularly suited to applications where large numbers of performance monitors must be deployed in different locations across a complex system, but where space to construct the performance monitors is limited.

In one example embodiment, digital events are detected. A constant current source, including a switch, is used to regulate a fixed amount of charge for each digital event that occurs. This fixed amount of charge per digital event is accumulated in a capacitor, the capacitor functioning like a "bucket" into which the charge is "dumped." The capacitor has a relatively large charge capacity in relation to the amount of charge representing each digital event so that it is possible to count large quantities of digital events. A quantity of digital events is estimated, or approximately counted, by measuring the accumulated charge in the capacitor.

A circuit arrangement is adapted to count a plurality of digital event pulses. In one example embodiment of the present invention, the circuit arrangement includes a transistor coupled between a constant current source and a capacitor, the transistor operating to switch the constant current source. In another example embodiment of the present invention, the circuit arrangement includes a transistor coupled between a power supply and a capacitor, the transistor being biased by the capacitor voltage to operate in the transistor's constant current region. The constant current source is arranged to provide current at a level within the transistor's total current-passing capacity. In one example embodiment of the present invention, the current magnitude of the constant current source is well within the total current-passing capacity of the switching transistor.

Responsive to each of a plurality of digital event pulses having a uniform duration, the transistor passes a substantially fixed amount of charge to the capacitor. A voltage divider circuit is adapted to provide a programmable threshold voltage level. A comparator circuit is coupled to the capacitor and to the voltage divider circuit. The comparator circuit generates an output signal responsive to a quantity of charge accumulated by the capacitor and the threshold voltage level. A discharge circuit is also coupled to the capacitor and arranged to remove charge from the capacitor. The capacitor has a capacity to accumulate a substantially fixed amount of charge for each of at least 100,000 digital event pulses.

FIG. 1 illustrates one example embodiment of a circuit arrangement 100 for counting a plurality of digital event pulses in accordance with the present invention. A storage capacitor 130 is coupled between a control output terminal 115 ("A") and a ground-level line 125. A first field-effect transistor 105, having a control terminal 175, is coupled between a power supply 110 and control output terminal 115. Together, power supply 110 and transistor 105 function as a constant current source 102. In one example embodiment, first transistor 105 is a NMOSFET. A second field effect transistor 120, having a control terminal 180, is coupled between control output terminal 115 and ground-level line 125. In one example embodiment, second transistor 120 is a NMOSFET. A comparator circuit 135 has a first control input 140 coupled to control output terminal 115, a second control input terminal 145, and an output terminal 170. In one example embodiment of a voltage divider circuit, a first resistor 155 is coupled in series with a second resistor 160 between ground-level line 125 and a bias voltage source 165. The voltage divider circuit develops a threshold voltage level $V_B$ at a bias location 150, bias location 150 being the junction between the first and second resistors. The threshold voltage level is controllable and determined by the relative resistance ratios of the first and second resistors, as is well known by those skilled in the relevant art. Voltage divider bias location 150 is coupled to second control input terminal 145.

Event pulses are generated external to the circuit illustrated in FIG. 1 by a sampling circuit for example. Control terminal 175 is arranged to receive a logic data signal comprising a plurality of digital event pulses. The time duration of each digital data pulse is substantially proportional to the quantity of digital events each digital pulse is intended to represent. In one example embodiment, one digital event is represented by a single digital event pulse, and each digital event pulse has the same substantially fixed time duration. In an alternative embodiment, a digital event pulse represents more than one digital event, the digital event pulse having a time duration proportional to the number of digital events represented as a multiple of the duration of a digital event pulse representing a single digital event. For example, a digital event pulse representing two digital events has a duration twice as long as an event pulse representing a single digital event.

A first state of the logic data signal turns on first field effect transistor 105 permitting passage of a fixed rate of charge from the power supply to the capacitor. Therefore, the amount of charge passing through first field effect transistor 105, from the power supply 110 to capacitor 130 is proportional to the time duration that a digital event pulse is in a first logic state keeping first field effect transistor turned on. In one example embodiment, a digital event pulse, representing a single digital event, has a time duration of 1 nanosecond. The constant current source provides a current of 10 nanoamps. Therefore, $10^{-17}$ Coulomb of charge is added to the capacitor for each digital event pulse. With a supply voltage of 2.5 Volts and a capacitor capacitance of 10 pF, charge added to the capacitor by approximately one million digital event pulses will raise the capacitor voltage by 1V (assuming a linear voltage operating range of the capacitor). The accuracy of the count depends on the linearity of the capacitor, the silicon characterization and the uniformity of the charge added for each digital event pulse.

In an alternative embodiment, the circuit arrangement is implemented using other circuit element values, or to effect different operating characteristics, than those described above without departing from the intent of the present invention. In other example embodiments, the supply voltage is greater than or less than 2.5V. Configuring the circuit arrangement to provide different current flow magnitudes greater or less than 10 nA is also contemplated by the present invention. The quantity of charge representative of each digital event may also be greater than or less than $10^{-17}$ Coulomb, so long as a uniform charge quantity is selected. Assuming a constant capacitor size, as the quantity of charge representing each digital event decreases, the count capacity of the capacitor increases. However, the adverse effect of noise interference upon count precision also increases for smaller charge quantities per digital event. Increasing charge quantity per digital event reduces capacitor count capacity, but increases count precision. In one example embodiment, capacitors size ranges from 5 pF to 50 pF; however, the circuit arrangement of the present invention can be constructed using larger or smaller capacitor sizes to achieve various count capacities. Those skilled in the relevant art are capable of selecting circuit arrangement design variables, including capacitor size, digital event pulse duration, transistor characteristics (biasing, etc.), power supply voltage level, charge quantity, etc. within the spirit of the present invention to achieve a circuit arrangement that is suitable to a particular application.

Figure 2:
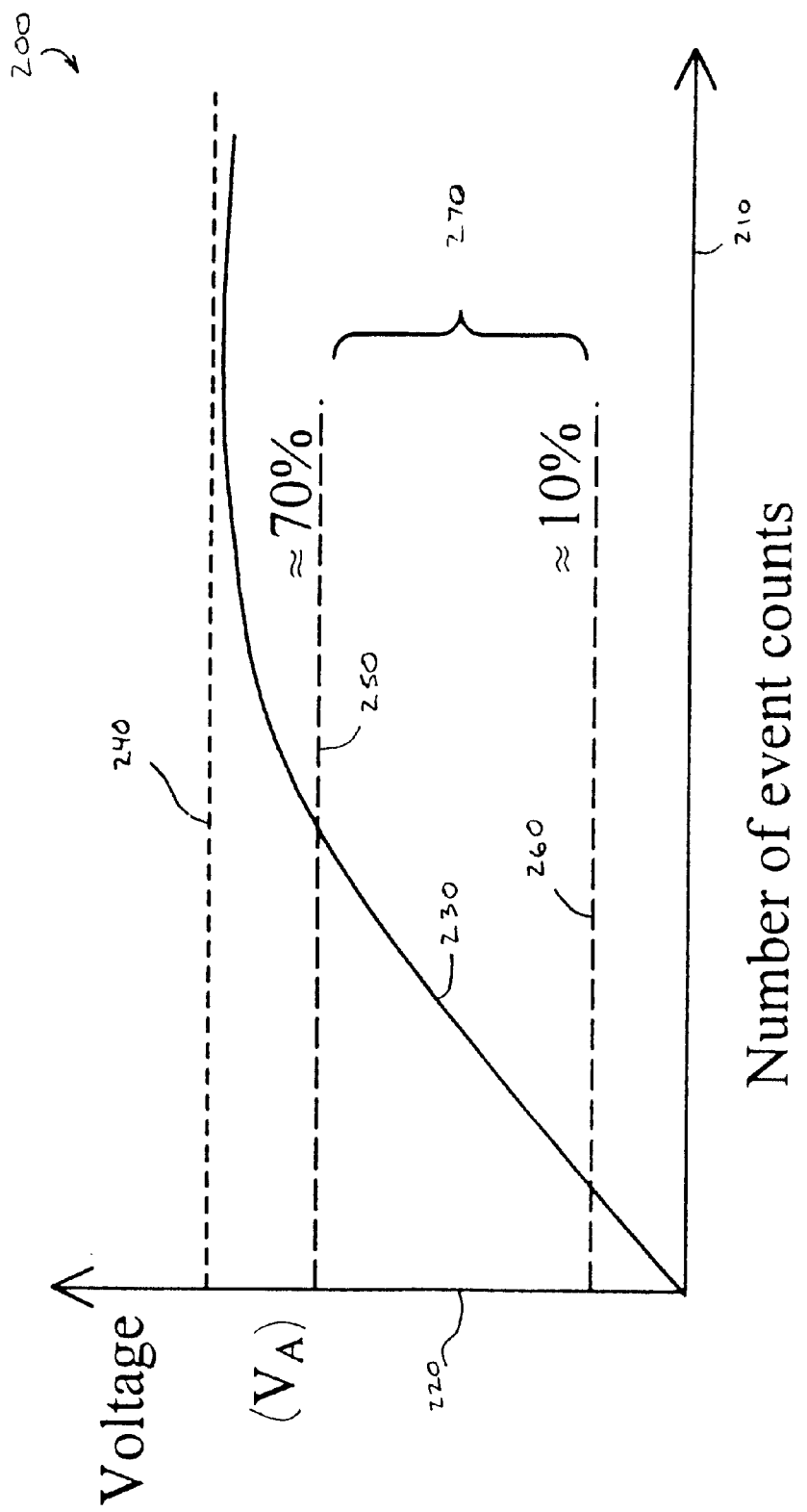
FIG. 2 is a charging diagram of one example embodiment of a digital events performance monitoring circuit capacitor in accordance with the present invention.

FIG. 2 illustrates a charging diagram 200 showing voltage response for one example embodiment of capacitor 130 of the present invention. A number of event counts is plotted along a horizontal axis 210. However, horizontal axis 210 is also representation of capacitor 130 charge (Coulombs) since the number of event counts is proportional to the charge contained by capacitor 130 where a constant current source provides a substantially fixed amount of charge for each event count. Capacitor 130 voltage (i.e., the voltage at control output terminal 115, $V_A$) is plotted along a vertical axis 220. Capacitor 130 voltage as a function of the number of event counts adding charge to capacitor 130 is indicated by curve 230. Supply voltage level is indicated for reference by dashed line 240.

Capacitor 130 has an approximately linear voltage range within which voltage is linearly proportional to incremental charge (event counts) added. In one embodiment of capacitor 130, the linear voltage range occurs at or below approximately seventy percent (70%) of power supply voltage level. In further embodiments of capacitor 130, the linear voltage range occurs below relative power supply voltage levels greater than or less than those illustrated in FIG. 2, dependent on capacitor structure and other factors known to those skilled in the art. For example, the linear voltage range for a diffusion junction capacitor, as a percentage of supply voltage level, will differ from the linear voltage region for a gate oxide capacitor, as is well-know by those skilled in the relevant art.

By adding charge to capacitor 130 (i.e., counting) in the linear voltage range of the capacitor, a count is determinable by measurement of the capacitor voltage change. In other embodiments of structures for accumulating electrical charge, having non-linear relationships, a look-up table or some other means for correlating measured voltage with charge is employed in determining count quantity from voltage measurement.

As can be observed in FIG. 2, capacitor 130's linear voltage range includes a linear voltage region 270. Linear voltage region 270 is a portion of linear voltage range above a minimum voltage $V_A$ level. The minimum voltage level of linear voltage region 270 is determined based upon circuit noise levels and set to enable accurate measurement of $V_A$. In one example embodiment of the present invention, linear voltage region 270 is defined from approximately ten percent (10%) of power supply voltage level to approximately seventy percent (70%) of power supply voltage level, endpoints included. Significant noise-induced errors can occur when measuring capacitor voltages, VA, below linear voltage region 270. Therefore in one example embodiment of the present invention, threshold voltages, VB, are preferably within the range of 10–70% of power supply voltage level to ensure a linear (with respect to count) and accurate input signals to comparator circuit 135.

In another embodiment of the present invention, the constant current source comprises a switching transistor and power supply. First field effect transistor 105 is operated in its constant current operating region to achieve a substantially fixed amount of current being added to capacitor 130 for each digital event pulse. In one embodiment of the present invention, transistor 105 has a constant current operating region when its drain-to-source voltage ($V_{ds}$) is greater than or equal to thirty percent (30%) of the power supply voltage level. As can be appreciated by the circuit configuration of the present invention, illustrated in FIG. 1, the power supply voltage level is divided across transistor 105 and capacitor 130. Therefore, transistor 105 $V_{ds}$ is greater than or equal to 30% of power supply voltage level when $V_A$ is less than or equal to 70% of power supply voltage level. In turn, biasing transistor 105 to operate in the constant current region generally implies that capacitor 130 is confined to operate primarily in a linear voltage region.

Transistor 105 is a PMOSFET in a further embodiment of the present invention; however, linearity of the constant current region is not as good as for a NMOSFET thereby adversely affecting count precision.

The combination of transistor 105 operating in its constant current region to pass a substantially fixed amount of charge to the capacitor with each digital event pulse, and the capacitor operating in the voltage range where the proportionality between capacitor voltage and charge is approximately linear, creates an approximately linear proportionality between digital event count and capacitor voltage. Furthermore, the useable voltage range within which the capacitor operates and properly bias the transistor to the transistor's constant current range, defines a capacitor useful charge capacity. Thus the capacitor's useful digital event counting capacity, in one example embodiment of the present invention, is sufficient to accumulate a substantially fixed amount of charge for each of at least 100,000 digital event pulses while biasing the transistor to operate in the transistor's constant current range.

It is desirable for circuit arrangement 100 to produce an output signal at output terminal 170 when a particular quantity of digital event pulses is counted. The output signal is communicated to report a performance condition, or alternatively, take some action, in response to the digital event pulses counted. Returning to FIG. 1 and circuit arrangement 100, comparator circuit 135 compares capacitor 130 voltage $V_A$ with respect to the threshold voltage level $V_B$ from bias location 150. Voltage $V_A$ is proportional to the total charge contained by capacitor 130 and therefore representative of the quantity of digital event pulses that have each added a substantially fixed quantity of charge to capacitor 130 for each digital event pulse. Likewise, $V_B$ is selected and representative of a quantity of digital event pulses at which further circuit action is desired. When $V_A$ exceeds $V_B$, comparator 135 produces an output signal at output terminal 170 which is used by other circuits (not shown in FIG. 1) to initiate some action based upon the quantity of digital events having been counted by circuit arrangement 100.

$V_B$ is chosen to represent a particular quantity, N, of digital event pulses. Voltage $V_B$ is chosen to be equivalent to capacitor 130 voltage $V_A$ when capacitor 130 has stored a total quantity of charge approximately equivalent to capacitor 130 starting voltage plus the voltage resulting from storing the substantially fixed amount of charge added to capacitor 130 for each of N event pulses. Voltage $V_B$ is selectable by the ratio of resistors 155 and 160 as a circuit arrangement design decision dependent on the application of the circuit arrangement.

In another example embodiment of the present invention, a threshold voltage level $V_B$ at a bias location 150 is variable by making one, or both, of resistors 155 and 160 variable, for example by using potentiometers in place of fixed resistors for resistors 160 and/or 155. In another example embodiment, additional resistors (not shown) are selectively switched in series and/or parallel with resistor 160 to modify voltage $V_B$. In another similar example embodiment, additional resistors (not shown) are selectively switched in series and/or parallel with resistor 155 to modify voltage $V_B$. In a further embodiment, both resistors 160 and 155 have additional resistors (not shown) added in series and/or parallel to change the resistance ration, and thus, threshold voltage level $V_B$.

Figure 3:
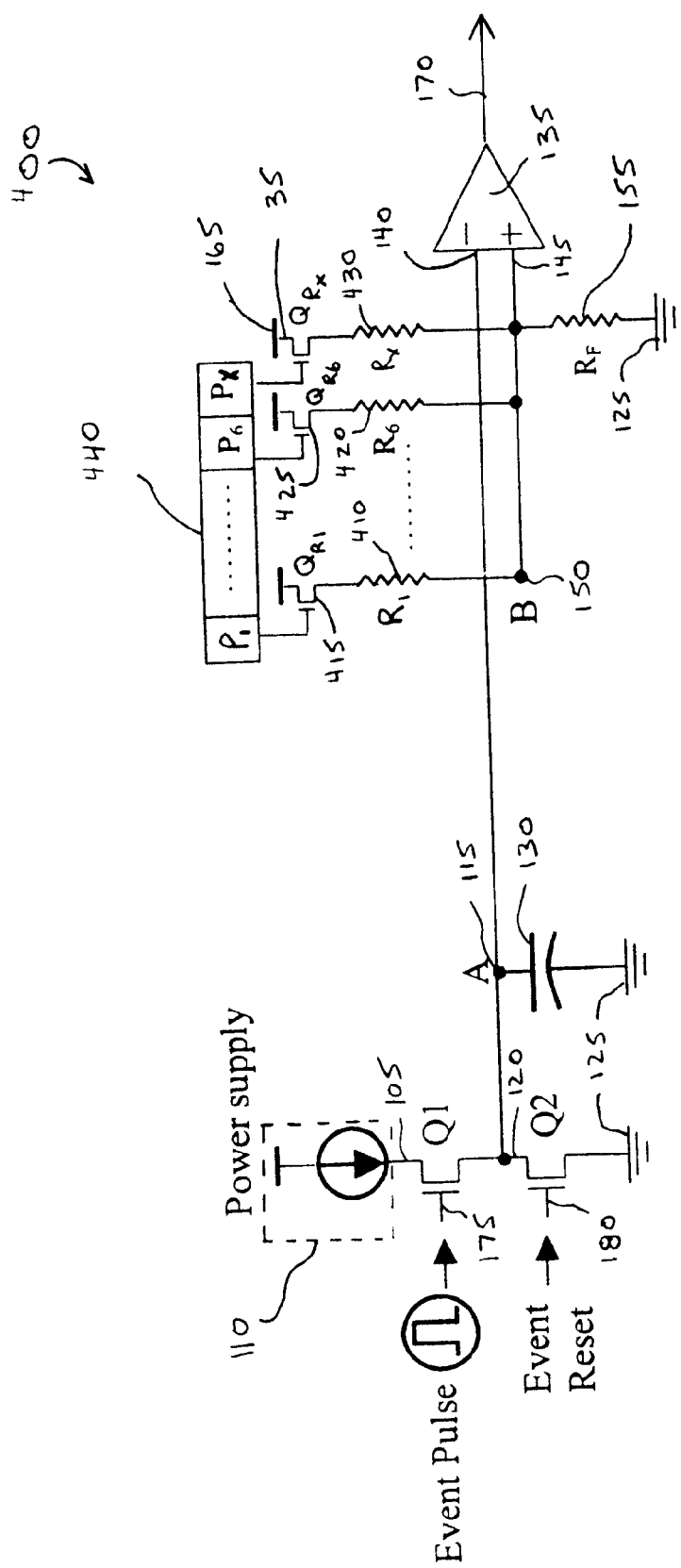
FIG. 3 is a circuit diagram of one example embodiment of a counter for monitoring digital event performance having a programmable threshold voltage level in accordance with the present invention.

FIG. 3 illustrates another example embodiment of a circuit arrangement 400 of the present invention having a programmable voltage divider circuit. A parallel arrangement of network resistors, forming a resistive network, is substituted in place of resistor 160 of circuit arrangement 100. The resistive network is coupled in series with a fixed resistor, $R_F$. A binary register 440 is comprised of X (in this example eight) bits, $P_1$ through $P_X$, as illustrated in FIG. 3. Each bit is coupled to a control input terminal, and controls, an associated transistor $Q_{R1}$ through $Q_{Rx}$. A first terminal of each resistor, $R_1$ through $R_X$, is coupled to bias location 150. A second terminal of each resistor, $R_1$ through $R_X$, is independently coupled to bias voltage supply 165 through one of the associated transistors, $Q_{R1}$ through $Q_{Rx}$. The value of a binary number stored in register 440 determines which of transistors $Q_{R1}$ through $Q_{Rx}$ are conducting, thereby selecting which of the associated resistors are included in the voltage divider network. Individual resistors are selectable alone, or in parallel combination with one or more other resistors of the set, $R_1$ through $R_x$. Resistor values, $R_1$ through $R_X$, are selected to achieve discrete threshold voltage levels, $V_B$, corresponding to digital event pulse counts of interest.

Assuming, as discussed for FIG. 1, a 10 pF capacitor and a power supply voltage of 2.5V switched by a transistor operating in a 10 nA constant current region, $10^{-17}$ Coulomb of charge is added to the capacitor for each digital event pulse. Therefore, approximately one million digital event pulses will raise the capacitor voltage by 1V in the linear voltage operating region of the capacitor. Threshold voltage level is therefore proportional to some digital event pulse quantity. Network resistor values are selected to provide voltage divider (resistance) ratios that produce threshold voltages corresponding to various digital event counts. The following table illustrates one possible embodiment of programmable voltage divider resistance ratios:

| Bit No. | $R_F/(R_F + R_X)$ | Threshold Voltage | No. Event Counts |
| --- | --- | --- | --- |
| $P_1$ | 0.1 | 0.25 V | 250,000 |
| $P_2$ | 0.2 | 0.50 V | 500,000 |
| $P_3$ | 0.3 | 0.75 V | 750,000 |
| $P_4$ | 0.4 | 1.00 V | 1,000,000 |
| $P_5$ | 0.5 | 1.25 V | 1,250,000 |
| $P_6$ | 0.6 | 1.50 V | 1,500,000 |
| $P_X$ | 0.7 | 1.75 V | 1,750,000 |

While is difficult to completely discharged within a limited reset, we should take into account of the possible residue charges remaining in the capacitor before the new event starts. Therefore we should characterize the circuit so that the "offset" value could be obtained for reference.

Referring once again to FIG. 1, an event reset is accomplished through second field effect transistor 120. Second field effect transistor 120, when conducting, discharges capacitor 130 to a near-zero voltage by providing a conduction path to ground for charge stored by capacitor 130. While completely discharging the capacitor within a limited reset time may not be possible, residue charge remaining in the capacitor at the start of a counting process are accounted for by determining a starting "offset" capacitor voltage. The threshold voltage is modified accordingly to reflect an accurate actual digital event count. Discharging capacitor 130 to a known count-starting voltage (approximately equal to zero), permits determining the quantity of charge accumulated during a digital event pulse counting process. The quantity of digital events is further determined by dividing the accumulated quantity of charge stored by capacitor 130 by the substantially fixed amount of charge added to capacitor 130 with each digital event pulse. In one embodiment of the present invention, a selectable (e.g., programmable) voltage divider circuit, as illustrated in FIG. 3 for example, is used during reset discharge of capacitor 130 to control second field effect transistor 120. Second field effect transistor 120 is controlled to conduct charge away from capacitor 130 until voltage $V_A$ is discharged. Alternatively, second field effect transistor 120 is controlled to conduct charge away from capacitor 130 for a fixed reset period of time, and any remaining capacitor charge is accounted for in determining a subsequent digital event count. Additional circuitry is optionally provided (not shown) to prevent first and second field effect transistors from conducting simultaneously.

Figure 4:
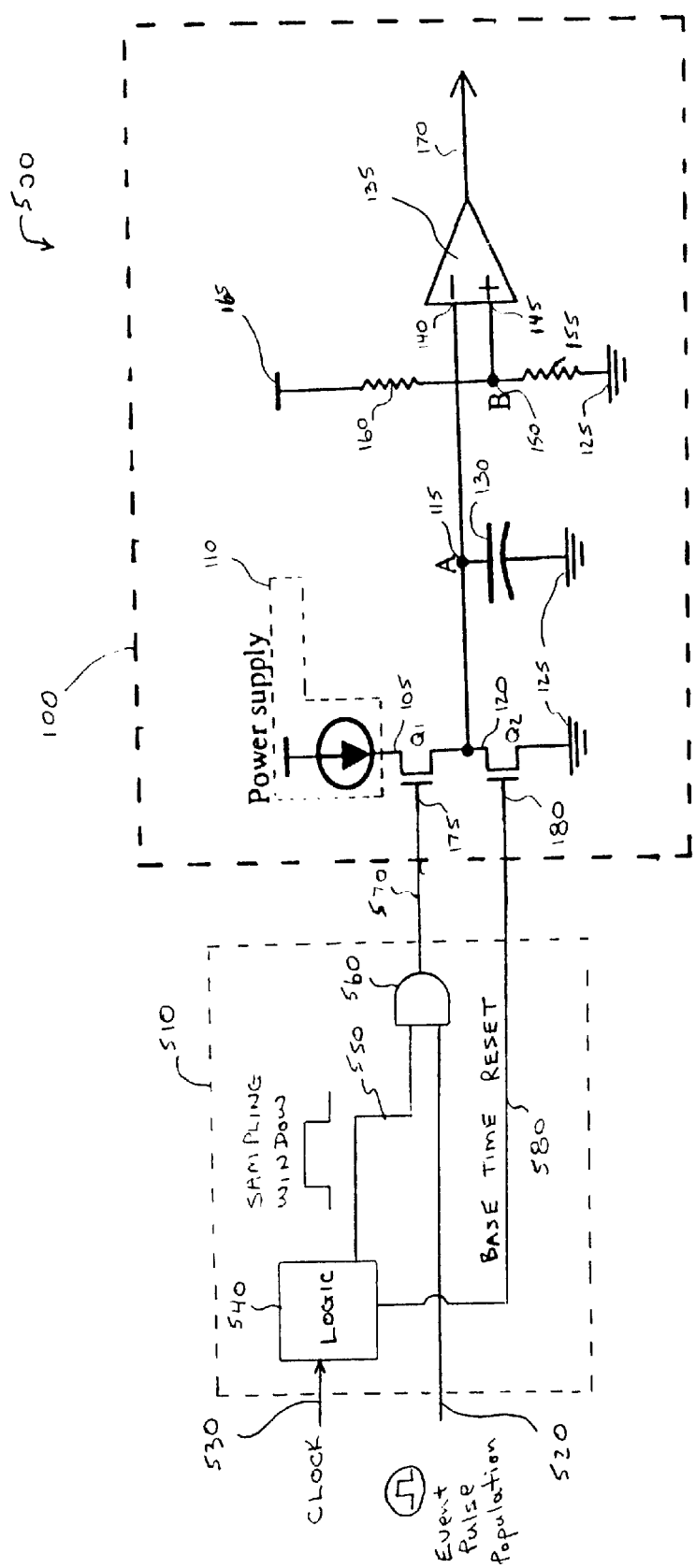
FIG. 4 is a circuit diagram of another example embodiment of a counter for monitoring digital event performance having a sampling circuit in accordance with the present invention.

FIG. 4 provides another example embodiment of a circuit arrangement 500 of the present invention. Circuit arrangement 500 includes a sampling circuit 510 coupled to circuit arrangement 100 (see FIG. 1), as illustrated. Circuit arrangement 500 functions to count a quantity of digital events occurring within a sample period, the sample period being a portion of a base time period. By discharging capacitor 130, to reset the digital event pulse count, circuit arrangement 500 can be used to count digital events occurring in each of a series of base tine intervals. In this manner, circuit arrangement is configured to determine a rate of digital events occurring within a period of time.

Sampling circuit 510 includes a logic circuit 540. Logic circuit 540 receives a clock signal on a clock input terminal 530 and initiates the sample period within the base time period. Logic circuit 540 also periodically generates a reset signal at a base time reset output terminal 580 to define the base time period and clear the counting circuit in preparation for another base time interval. Base time reset output terminal 580 is coupled to second field effect transistor control terminal 180. Logic circuit 540 reset signal resets counting circuit arrangement 100 by discharging capacitor 130.

Logic circuit 540 is additionally coupled to a first comparator input terminal 550 and provides a sampling window signal to comparator 560. Comparator 560 has a second input terminal 520 for receiving a logic data signal comprising a population of digital event pulses. Comparator 560 passes the logic data signal to counting circuit arrangement 100 whenever the sampling window signal is exerted. In a further embodiment of the present invention, logic circuit provides a sampling window signal to comparator 560 beginning at pseudo-random times within base time interval. In selecting pseudo-random sampling windows within base time interval, the sampled count is statistically representative of the population of digital event pulses occurring within the time interval.

Accordingly, the present invention is not to be necessarily limited to the particular examples described above, but is intended to cover all aspects of the invention as fairly set out in the attached claims. For instance, while a VLSI system chip performance monitoring configurations are illustrated, other performance monitoring constructions can benefit from the above-mentioned teachings. Various modifications, equivalent processes, as well as numerous structures, including electrical charge storage devices alternative to capacitor implementations, to which the present invention may be applicable will be readily apparent to those of skill in the art to which the present invention is directed upon review of the present specification. The claims are intended to cover such modifications and devices.

I claim:

1. A circuit arrangement adapted to count a plurality of digital event pulses, comprising:
    a power supply configured to provide a fixed amount of charge;
    a switch arrangement coupled to the power supply and arranged to pass a substantially fixed amount of charge from the power supply with each digital event pulse;
    a capacitor coupled to the switch arrangement, wherein the capacitor accumulates the fixed amount of charge with each digital event pulse;
    a voltage divider circuit adapted to provide a threshold voltage level; and
    a comparator circuit coupled to the capacitor and the voltage divider circuit, the comparator circuit adapted to generate an output signal responsive to a quantity of charge accumulated by the capacitor and the threshold voltage level.

2. The circuit arrangement of claim 1, wherein the switch arrangement comprises a transistor biased to operate in a constant current region.

3. The circuit arrangement of claim 2, wherein the transistor is an NMOSFET.

4. The circuit arrangement of claim 3, wherein the capacitor has a voltage proportional to accumulated charge, the capacitor voltage biasing the transistor to operate in a constant current region.

5. The circuit arrangement of claim 4, wherein the capacitor has a capacity to accumulate a substantially fixed amount of charge for each of at least 100,000 digital event pulses maintaining the capacitor voltage in a range to bias operation of the transistor in the constant current region.

6. The circuit arrangement of claim 5, wherein the capacitor has a capacity to accumulate a substantially fixed amount of charge for each of at least 1,000,000 digital event pulses maintaining the capacitor voltage in a range to bias operation of the transistor in the constant current region.

7. The circuit arrangement of claim 1, further comprising a transistor coupled between the constant current source and the capacitor, wherein the transistor is responsive to each of the plurality of digital event pulses and the constant current source is adapted to provide current at a magnitude less than the transistor's total current-passing capacity.

8. The circuit arrangement of claim 1, wherein the threshold voltage level is variable.

9. The circuit arrangement of claim 8, wherein the threshold voltage level is greater than or equal to ten percent (10%) of a power supply voltage level.

10. The circuit arrangement of claim 8, wherein the threshold level is programmable.

11. The circuit arrangement of claim 10, wherein the voltage divider circuit further includes:
    a register having N bits; and
    a resistive network coupled in series with a fixed resistor, the resistive network including a parallel arrangement of N network resistors, each resistor coupled in series to a transistor having a control terminal coupled to one of the N register bits, and each transistor adapted to couple one of the N resistors to a bias voltage power supply responsive to a register bit value.

12. The circuit arrangement of claim 1, further comprising a discharge circuit coupled to the capacitor, the discharge circuit arranged to remove charge from the capacitor.

13. The circuit arrangement or claim 12, further comprising a sampling circuit coupled to the switch arrangement, the sampling circuit arranged to communicate a plurality of digital event pulses to the switch arrangement during a sample period portion of a base time period.

14. The circuit arrangement of claim 13, wherein the sampling circuit is further coupled to the discharge circuit, the sampling circuit arranged to communicate an end of the base time period signal to the discharge circuit, and the discharge circuit adapted to remove charge from the capacitor responsive to the end of base time period signal.

15. A circuit arrangement adapted to count a plurality of digital event pulses, comprising:
    a capacitor having a voltage proportional to accumulated charge;
    a power supply;
    a transistor coupled between the power supply and the capacitor, the transistor biased by the capacitor voltage to operate in a constant current region and adapted to pass a substantially fixed amount of charge to the capacitor responsive to each of the plurality of digital event pulses;

a voltage divider circuit adapted to provide a programmable threshold voltage level;

a comparator circuit coupled to the capacitor and the voltage divider circuit, the comparator circuit adapted to generate an output signal responsive to a quantity of charge accumulated by the capacitor and the programmable threshold voltage level; and a discharge circuit coupled to the capacitor, the discharge circuit arranged to remove charge from the capacitor, wherein the capacitor has a capacity to accumulate a substantially fixed amount of charge for each of at least 100,000 digital events maintaining the capacitor voltage in a range to bias operation of the transistor in the constant current region.

16. A method for counting a plurality of digital pulses, comprising:

discharging a capacitor having a voltage proportional to accumulated charge to a starting charge level;

receiving a plurality of digital event pulses;

passing a substantially fixed amount of charge through a transistor coupled to the capacitor in response to each digital event pulse;

adding the substantially fixed amount of charge to the capacitor with each digital event pulse; and generating an output control signal responsive to the charge of the capacitor and a threshold voltage level, wherein the threshold voltage level is set by a voltage divider circuit.

17. The method of claim 16, further comprising biasing the transistor with the capacitor voltage to pass a constant current magnitude from a power supply to the capacitor.

18. The method of claim 16, further comprising controlling a constant current source with the transistor, wherein the constant current source provides to the transistor a constant current having a magnitude less than the transistor's total current-passing capacity.

19. The method of claim 16, wherein the capacitor has a capacity to accumulate a substantially fixed amount of charge for each of at least 100,000 digital events maintaining the capacitor voltage in a range to bias operation of the transistor in the constant current region.

20. The method of claim 19, wherein the threshold voltage level is variable.

21. The method of claim 20, wherein the threshold voltage level is programmable.

22. The method of claim 16, further comprising:

selecting the plurality of digital event pulses from a population of digital event pulses occurring within a time interval.

23. The method of claim 22, wherein the plurality of digital event pulses is selected pseudo-randomly to be statistically representative of the population of digital event pulses occurring within the time interval.

24. The circuit arrangement of claim 15, wherein the capacitor accumulates the fixed amount of charge with each digital event pulse.

* * * * *